(12) United States Patent
Hirase et al.

(10) Patent No.: US 12,094,895 B2
(45) Date of Patent: Sep. 17, 2024

(54) IMAGING DEVICE WITH MULTIPLE DIFFUSION REGIONS AND CAPACITOR ELEMENT

(71) Applicant: Panasonic Intellectual Property Management Co., Ltd., Osaka (JP)

(72) Inventors: Junji Hirase, Osaka (JP); Yoshihiro Sato, Osaka (JP); Yasuyuki Endoh, Hyogo (JP); Hiroyuki Amikawa, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 9 days.

(21) Appl. No.: 17/838,911

(22) Filed: Jun. 13, 2022

(65) Prior Publication Data

US 2022/0310673 A1    Sep. 29, 2022

Related U.S. Application Data

(60) Division of application No. 16/878,667, filed on May 20, 2020, now Pat. No. 11,393,858, which is a
(Continued)

(30) Foreign Application Priority Data

Nov. 30, 2017  (JP) .................................. 2017-230275
Jul. 5, 2018  (JP) .................................. 2018-128337

(51) Int. Cl.
*H01L 27/146*  (2006.01)
*H01L 27/02*  (2006.01)
(Continued)

(52) U.S. Cl.
CPC ...... *H01L 27/1461* (2013.01); *H01L 27/0288* (2013.01); *H01L 27/14603* (2013.01);
(Continued)

(58) Field of Classification Search
None
See application file for complete search history.

(56) References Cited

U.S. PATENT DOCUMENTS 5,268,576 A * 12/1993 Dudley .................... H04N 5/33
                                                   348/E5.079
5,939,742 A *  8/1999 Yiannoulos ....... H01L 27/14609
                                                         257/292
(Continued)

FOREIGN PATENT DOCUMENTS

CN  101939982 B  *  1/2013  ....... H01L 27/14609
JP  10-098175         4/1998
(Continued)

OTHER PUBLICATIONS

Machine Translation of JP-2011-204797-A, Kiyota et al., 17 pages. (Year: 2011).*
(Continued)

*Primary Examiner* — Scott B Geyer
(74) *Attorney, Agent, or Firm* — Rimon P.C.

(57) ABSTRACT

An imaging device having a semiconductor substrate including: a semiconductor region including an impurity of a first conductivity type, a first diffusion region that is in contact with the semiconductor region, that includes an impurity of a second conductivity type different from the first conductivity type, and that converts incident light into charges, and a second diffusion region that includes an impurity of the second conductivity type and that directly accumulates at least a part of the charges generated in the first diffusion region. The imaging device further includes a contact plug in contact with the second diffusion region, and a capacitive element electrically connected to the second diffusion region through the contact plug.

19 Claims, 9 Drawing Sheets

Related U.S. Application Data continuation of application No. PCT/JP2018/041078, filed on Nov. 6, 2018.

(51) Int. Cl.
*H04N 25/57* (2023.01)
*H04N 25/75* (2023.01)
*H04N 25/76* (2023.01)

(52) U.S. Cl.
CPC .. *H01L 27/14636* (2013.01); *H01L 27/14643* (2013.01); *H04N 25/57* (2023.01); *H04N 25/75* (2023.01); *H04N 25/76* (2023.01)

(56) References Cited

U.S. PATENT DOCUMENTS

| | | | | |
|---|---|---|---|---|
| 6,204,524 B1* | 3/2001 | Rhodes | ............ | H01L 27/14643 257/E21.018 |
| 6,429,470 B1* | 8/2002 | Rhodes | ............ | H01L 27/14643 257/E21.018 |
| 6,677,613 B1 | 1/2004 | Yamazaki et al. | | |
| 6,852,591 B2* | 2/2005 | Rhodes | ............ | H01L 27/14609 257/E21.018 |
| 7,026,596 B2* | 4/2006 | Fossum | ................ | H04N 25/585 348/E3.018 |
| 7,535,042 B2* | 5/2009 | Rhodes | ............ | H01L 27/14609 257/292 |
| 8,018,515 B2* | 9/2011 | Mori | ...................... | H04N 25/59 348/308 |
| 8,836,833 B2* | 9/2014 | Yamashita | ........... | H04N 25/616 348/308 |
| 9,197,830 B2* | 11/2015 | Mori | ...................... | H04N 25/79 |
| 9,728,667 B1 | 8/2017 | Johnson et al. | | |
| 10,498,983 B2 | 12/2019 | Sakano et al. | | |
| 10,658,406 B2* | 5/2020 | Sato | ................ | H01L 27/14603 |
| 2002/0020863 A1 | 2/2002 | Lee et al. | | |
| 2002/0117690 A1* | 8/2002 | Rhodes | ............ | H01L 27/14643 257/E21.018 |
| 2002/0140009 A1 | 10/2002 | Lee et al. | | |
| 2002/0179949 A1* | 12/2002 | Sakao | .................... | H01L 28/40 257/296 |
| 2003/0096443 A1 | 5/2003 | Hwang | | |
| 2004/0043529 A1* | 3/2004 | Fossum | ............ | H01L 27/14643 438/70 |
| 2004/0056297 A1 | 3/2004 | Iki et al. | | |
| 2004/0206991 A1* | 10/2004 | Yato | .................. | H01L 27/14643 257/292 |
| 2004/0251482 A1 | 12/2004 | Rhodes | | |
| 2005/0032281 A1* | 2/2005 | McClure | .......... | H01L 27/14689 257/E27.15 |
| 2005/0092894 A1* | 5/2005 | Fossum | ................ | H04N 25/778 348/E3.018 |
| 2005/0167707 A1* | 8/2005 | Funaki | ............ | H01L 27/14687 257/E27.152 |
| 2005/0280046 A1* | 12/2005 | Shin | .................. | H01L 27/14812 257/E27.152 |
| 2007/0052055 A1* | 3/2007 | McKee | ............ | H01L 27/14641 257/E27.134 |
| 2008/0048292 A1* | 2/2008 | Baniecki | ................ | H10B 53/30 257/532 |
| 2008/0061216 A1* | 3/2008 | Kasuga | .................. | H04N 23/76 348/E3.018 |
| 2008/0156966 A1* | 7/2008 | Hsieh | .................. | H04N 25/778 257/292 |
| 2008/0192134 A1* | 8/2008 | Mori | ................ | H01L 27/14609 348/E3.018 |
| 2009/0200587 A1* | 8/2009 | Venezia | ............ | H01L 27/14687 257/292 |
| 2010/0123812 A1* | 5/2010 | Sekiguchi | .............. | H04N 25/76 250/214 R |
| 2010/0230579 A1* | 9/2010 | Watanabe | ............ | H04N 25/778 250/214 A |
| 2011/0049589 A1* | 3/2011 | Chuang | ............. | H01L 27/14609 257/292 |
| 2011/0315854 A1* | 12/2011 | Janesick | .............. | H04N 25/771 250/214 P |
| 2012/0001779 A1* | 1/2012 | Fife | ..................... | G01N 27/4145 422/82.01 |
| 2012/0273651 A1* | 11/2012 | Willassen | ............. | H04N 25/59 250/206 |
| 2013/0056808 A1* | 3/2013 | Tai | ...................... | H01L 27/1463 257/292 |
| 2014/0014816 A1* | 1/2014 | Takeda | ................... | H04N 25/77 257/229 |
| 2014/0022432 A1* | 1/2014 | Goto | ................. | H01L 27/14609 348/308 |
| 2014/0263947 A1* | 9/2014 | Dierickx | ........... | H01L 27/14609 250/206 |
| 2014/0284669 A1 | 9/2014 | Arcuri et al. | | |
| 2015/0028401 A1* | 1/2015 | Kuwabara | ......... | H01L 27/14643 257/291 |
| 2015/0380448 A1* | 12/2015 | Chen | ................. | H01L 27/14629 257/228 |
| 2016/0105622 A1 | 4/2016 | Tamaki | | |
| 2016/0172396 A1* | 6/2016 | Masuda | ............ | H01L 27/14658 257/295 |
| 2016/0219239 A1* | 7/2016 | Itoh | ....................... | H04N 25/709 |
| 2016/0276380 A1* | 9/2016 | Yang | ................. | H01L 27/14636 |
| 2017/0077155 A1 | 3/2017 | Sano et al. | | |
| 2018/0331140 A1* | 11/2018 | Sato | ....................... | H04N 25/65 |
| 2019/0081096 A1* | 3/2019 | Tomekawa | ........ | H01L 27/14609 |
| 2019/0181178 A1* | 6/2019 | Takase | ............. | H01L 27/14612 |

FOREIGN PATENT DOCUMENTS

| | | | | |
|---|---|---|---|---|
| JP | 2002-016243 | | 1/2002 | |
| JP | 2002-094042 | | 3/2002 | |
| JP | 2003-264278 | | 9/2003 | |
| JP | 2003-282857 | | 10/2003 | |
| JP | 2005-101864 | | 4/2005 | |
| JP | 2005-223146 | | 8/2005 | |
| JP | 2011204797 A | * | 10/2011 | ....... H01L 27/14609 |
| JP | 2015-233122 | | 12/2015 | |
| JP | 2016-076921 | | 5/2016 | |

OTHER PUBLICATIONS

International Search Report of PCT application No. PCT/JP2018/041078 dated Jan. 29, 2019.

Notice of Allowance Issued in U.S. Appl. No. 16/878,667, dated Mar. 25, 2022.

* cited by examiner

IMAGING DEVICE WITH MULTIPLE DIFFUSION REGIONS AND CAPACITOR ELEMENT

CROSS-REFERENCE OF RELATED APPLICATIONS

This Application is a continuation of U.S. patent application Ser. No. 16/878,667, filed on May 20, 2020, which is continuation of International Application No. PCT/JP2018/041078, filed on Nov. 6, 2018, which claims the benefit of foreign priority of Japanese Patent Application No. 2017-230275, filed on Nov. 30, 2017, and Japanese Patent Application No. 2018-128337, filed on Jul. 5, 2018, the contents all of which are incorporated herein by reference.

BACKGROUND

1. Technical Field

The present disclosure relates to an imaging device.

2. Description of the Related Art

Charge-coupled device (CCD) image sensors and complementary metal-oxide-semiconductor (CMOS) image sensors are widely used for digital cameras and the like. As widely known, these image sensors each include photodiodes formed on a semiconductor substrate.

In order to form photoelectric conversion units such as photodiodes and peripheral circuits on a semiconductor substrate in such an image sensor, a method for reducing pixel size while achieving a dynamic range has been conceived (Japanese Unexamined Patent Application Publication No. 2015-233122).

SUMMARY

It is desired to increase a dynamic range while reducing dark current.

In one general aspect, the techniques disclosed here feature an imaging device having a semiconductor substrate including: a semiconductor region including an impurity of a first conductivity type, a first diffusion region that is in contact with the semiconductor region, that includes an impurity of a second conductivity type different from the first conductivity type, and that converts incident light into charges, and a second diffusion region that includes an impurity of the second conductivity type and that directly accumulates at least a part of the charges generated in the first diffusion region. The imaging device further includes a contact plug in contact with the second diffusion region, and a capacitive element electrically connected to the second diffusion region through the contact plug.

It should be noted that a general or specific aspect may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
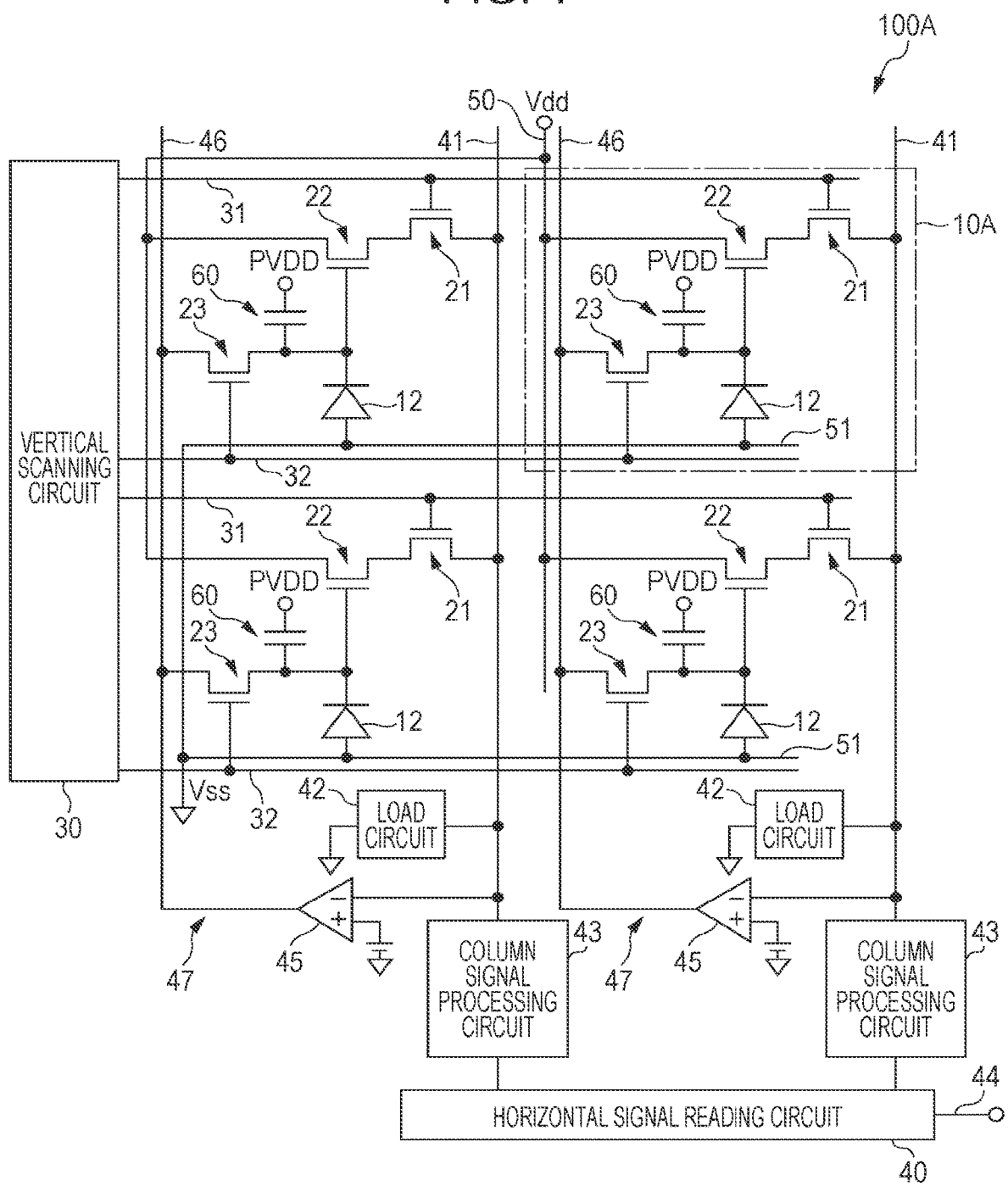
FIG. 1 is a diagram illustrating the circuit configuration of an imaging device according to an embodiment.

In the imaging device described in Japanese Unexamined Patent Application Publication No. 2015-233122, a dynamic range is increased by providing a pixel circuit such as a signal detection circuit in a layer different from one in which a photodiode is provided. In the imaging device described in Japanese Unexamined Patent Application Publication No. 2015-233122, however, it is difficult to say that the dynamic range can be increased while reducing dark current. It is desired to increase the dynamic range while reducing dark current.

An outline of an aspect of the present disclosure is as follows.

Item 1

An imaging device including:
 a semiconductor substrate including
  a semiconductor region including an impurity of a first conductivity type,
   a first diffusion region that is in contact with the semiconductor region, that includes an impurity of a second conductivity type different from the first conductivity type, and that converts incident light into charges, and
   a second diffusion region that includes an impurity of the second conductivity type and that accumulates at least a part of the charges flowing from the first diffusion region;
 a first transistor that includes a first gate electrode located on the semiconductor substrate and that includes the second diffusion region as one of a source and a drain;
 a contact plug electrically connected to the second diffusion region;
 a capacitive element one end of which is electrically connected to the contact plug; and
 a second transistor that includes a second gate electrode located on the semiconductor substrate, the second gate electrode being electrically connected to the one end of the capacitive element.

Item 2

The imaging device according to Item 1, wherein the semiconductor substrate includes a third diffusion region that covers an upper surface of the first diffusion region and that includes an impurity of the first conductivity type.

Item 3

The imaging device according to Item 1, wherein
 the semiconductor substrate includes a well region including an impurity of the first conductivity type, and
 the second diffusion region is located in the well region.

Item 4
The imaging device according to Item 2, wherein the semiconductor substrate includes a first isolation region that electrically insulates the second diffusion region and the third diffusion region from each other.

Item 5
The imaging device according to Item 4, wherein
the first isolation region includes a second isolation region, and
a concentration of the impurity of the first conductivity type in the second isolation region is higher than a concentration of the impurity of the first conductivity type in the third diffusion region.

Item 6
The imaging device according to Item 1, wherein the semiconductor substrate includes a fourth diffusion region that is in contact with the first diffusion region and the second diffusion region and that includes an impurity of the second conductivity type.

Item 7
The imaging device according to Item 3, wherein the second diffusion region faces the first diffusion region through the well region.

Item 8
The imaging device according to Item 1, wherein
the semiconductor substrate includes a fifth diffusion region including an impurity of the second conductivity type,
the first transistor includes the fifth diffusion region as the other of the source and the drain, and
a concentration of the impurity of the second conductivity type in the second diffusion region is lower than a concentration of the impurity of the second conductivity type in the fifth diffusion region.

Item 9
The imaging device according to Item 1, wherein
the semiconductor substrate includes a fifth diffusion region including an impurity of the second conductivity type,
the first transistor includes the fifth diffusion region as the other of the source and the drain, and
when viewed in a direction perpendicular to the semiconductor substrate, an area of the second diffusion region is smaller than an area of the fifth diffusion region.

In addition, an outline of another aspect of the present disclosure is as follows.

An imaging device according to the other aspect of the present disclosure includes a semiconductor substrate including a first surface and a second surface opposite the first surface, a well region that is located in the semiconductor substrate and that includes an impurity of a first conductivity type, a photoelectric conversion unit that includes a first diffusion region in contact with the well region and including an impurity of the second conductivity type different from the first conductivity type, and a third diffusion region exposed on the first surface, in contact with the first diffusion region, and including an impurity of the first conductivity type and that converts incident light into charges, a second diffusion region that is exposed on the first surface, that is located in the well region, that is electrically connected to the first diffusion region in the semiconductor substrate, that includes an impurity of the second conductivity type, and that accumulates the charges, a first transistor including the second diffusion region as one of a source and a drain, a contact plug connected to the second diffusion region, a capacitive element electrically connected to the second diffusion region through the contact plug, and a second transistor a gate of which is electrically connected to the capacitive element.

As described above, when the third diffusion region is provided in the photoelectric conversion unit between the first diffusion region and the first surface of the semiconductor substrate, dark current that can be caused due to a defect at an interface between the first diffusion region and the semiconductor substrate is pinned in the third diffusion region. As a result, dark current at the interface between the first diffusion region and the semiconductor substrate can be reduced more effectively.

In addition, when both the first diffusion region and the second diffusion region include an impurity of the second conductivity type and the second diffusion region is electrically connected to the first diffusion region, charges generated in the first diffusion region can be directly accumulated in the second diffusion region. A transfer transistor that transfers charges generated as a result of photoelectric conversion from the first diffusion region to the second diffusion region, therefore, becomes unnecessary. When charges are transferred through the transfer transistor, dark current is caused due to the transfer transistor. In the imaging device according to the other aspect of the present disclosure, however, the first diffusion region of the photoelectric conversion unit and the second diffusion region that accumulates charges are directly connected to each other electrically, dark current caused during the accumulation of charges can be reduced. In addition, since the transfer transistor is not necessary, a pixel circuit can be reduced in size. As a result, a large photoelectric conversion unit can be formed, and a dynamic range of the imaging device can be increased.

In addition, since the second diffusion region that accumulates charges and the capacitive element are electrically connected to each other, the second diffusion region can achieve a higher capacitance. The dynamic range, therefore, can be further increased.

For example, the imaging device according to the other aspect of the present disclosure may further include a first isolation region that electrically insulates the second diffusion region and the third diffusion region from each other. As a result, dark current caused between the third diffusion region, which includes the impurity of the first conductivity type, and the second diffusion region, which includes the impurity of the second conductivity, can be reduced.

For example, the imaging device according to the other aspect of the present disclosure may further include a second isolation region that is located around the first isolation region and that includes an impurity of the first conductivity type with a concentration higher than in the third diffusion region.

The imaging device according to the other aspect of the present disclosure thus includes, around the first isolation region, that is, at an interface between the first isolation region and the third diffusion region and an interface between the first isolation region and the second diffusion region, for example, the second isolation region including the impurity of the first conductivity type whose concentration is higher than that of the impurity of the first conductivity type in the third diffusion region. As a result, a potential barrier is formed between the second diffusion region and the third diffusion region, and the second diffusion region and the third diffusion region can be more strongly insulated from each other electrically. Dark current caused between the second diffusion region and the third diffusion region can be further reduced.

For example, the imaging device according to the other aspect of the present disclosure may further include a fourth diffusion region in contact with the first diffusion region and the second diffusion region and including an impurity of the second conductivity type.

With this configuration, the first diffusion region and the second diffusion region can be securely connected to each other electrically through the fourth diffusion region.

For example, in the imaging device according to the other aspect of the present disclosure, the first diffusion region and the second diffusion region may face each other through the well region.

With this configuration, the well region serves as a potential region, and if the amount of charge accumulated in the first diffusion region becomes equal to or larger than a certain value, charges flow into the third region.

For example, in the imaging device according to the other aspect of the present disclosure, the concentration of the impurity of the second conductivity type in the second diffusion region may be lower than in the other of the source and the drain of the first transistor.

Since the concentration of the impurity of the second conductivity type included in the second diffusion region is lower than in the other of the source and the drain of the first transistor, contact concentration at a contact between the second diffusion region and the well region decreases. Dark current in the second diffusion region, therefore, can be reduced.

For example, in the imaging device according to the other aspect of the present disclosure, when viewed in a direction perpendicular to the semiconductor substrate, the second diffusion region may be smaller in area than the other of the source and the drain of the first transistor.

By making the second diffusion region small in area, dark current in the second diffusion region can be reduced.

An embodiment of the present disclosure will be described in detail hereinafter with reference to the drawings. The following embodiment is a general or specific example. Values, shapes, materials, components, arrangement and connection modes of the components, steps, order of the steps, and the like mentioned in the following embodiment are examples, and do not limit the present disclosure. Various aspects described herein may be combined together insofar as no contradiction is caused. Among the components described in the following embodiment, ones not described in the independent claim, which defines a broadest concept, will be described as optional components. Components having substantially the same functions are given the same reference numerals in the drawings, and redundant description thereof might be omitted or simplified.

Various elements illustrated in the drawings are schematically illustrated to facilitate understanding of the present disclosure, and dimensions and appearances thereof might be different from reality.

A light receiving side of an imaging device will be referred to as an "upper side" and an opposite side of the imaging device will be referred as a "lower side" herein. Surfaces of members oriented on the light receiving side of the imaging device will be referred to as "upper surfaces", and surfaces of the members oriented on the opposite side of the imaging device will be referred to as "lower surfaces". The terms "upper side", "lower side", "upper surfaces", and "lower surfaces" are used to specify relative orientations of the members and not intended to limit an attitude of the imaging device during use.

Embodiment

FIG. 1 is a diagram illustrating the circuit configuration of an imaging device 100A according to the present embodiment.

The imaging device 100A illustrated in FIG. 1 includes a plurality of pixels 10A and peripheral circuits. The pixels 10A are arranged on a semiconductor substrate in two dimensions to form a pixel area.

In an example illustrated in FIG. 1, the pixels 10A are arranged in row and column directions. The row and column directions herein refer to directions in which rows and columns extend. That is, a length direction of the drawings is the column direction, and a width direction of the drawings is the column direction. The pixels 10A may be arranged in one dimension, instead.

The pixels 10A are each connected to a power supply line 50. A certain power supply voltage Vdd is supplied to each of the pixels 10A through the power supply line 50. As described in detail later, the pixels 10A each include a photoelectric conversion unit 12 (also referred to as a "photodiode 12") in the semiconductor substrate. The photoelectric conversion unit 12 includes a first diffusion region 2 (refer to FIG. 2) that converts incident light into charges. As illustrated in FIG. 1, the imaging device 100A includes accumulation control lines 51 for applying a constant voltage to anodes of all the photodiodes 12.

The peripheral circuits of the imaging device 100A include a vertical scanning circuit 30 (also referred to as a "row scanning circuit"), load circuits 42, column signal processing circuits 43 (also referred to as "row signal accumulation circuits"), a horizontal signal reading circuit 40 (also referred to as a "column scanning circuit"), and inverting amplifiers 45. In the example of the configuration illustrated in FIG. 1, a column signal processing circuit 43, a load circuit 42, and an inverting amplifier 45 is provided for each column of the pixels 10A arranged in two dimensions. That is, in this example, the peripheral circuits include a plurality of column signal processing circuits 43, a plurality of load circuits 42, and a plurality of inverting amplifiers 45.

Address signal lines 31 and reset signal lines 32 are connected to the vertical scanning circuit 30. The vertical scanning circuit 30 outputs certain voltages to the address signal lines 31 to select the pixels 10A in units of rows. As a result, signal voltages of the selected pixels 10A are read and pixel electrodes are reset, the latter of which will be described later.

The pixels 10A arranged in each column are electrically connected to one of the column signal processing circuits 43 through a corresponding vertical signal line 41. Each vertical signal line 41 is connected to a corresponding one of the load circuits 42. The column signal processing circuits 43 perform noise reduction signal processing typified by correlated double sampling, analog-to-digital conversion (A/D conversion), and the like. The horizontal signal reading circuit 40 is connected to the column signal processing circuits 43 provided in correspondence with the columns of the pixels 10A. The horizontal signal reading circuit 40 sequentially reads signals from the column signal processing circuits 43 to a horizontal common signal line 44.

In the example of the configuration illustrated in FIG. 1, the inverting amplifiers 45 are provided in correspondence with the columns of the inverting amplifiers 45. Negative input terminals of the inverting amplifiers 45 are connected to the corresponding vertical signal lines 41. A certain voltage is supplied to positive input terminals of the inverting amplifiers 45. The certain voltage is, for example, a positive voltage of 1 V or about 1 V. Output terminals of the inverting amplifiers 45 are connected to pixels 10A connected to the negative input terminals of the inverting amplifiers 45 through feedback lines 46 provided in correspondence with the columns. The inverting amplifiers 45 constitute a part of feedback circuits 47 for negatively feeding back outputs of the pixels 10A. The inverting amplifiers 45 may be referred to as feedback amplifiers.

The photodiodes 12 are photoelectric conversion regions that receive incident light and that cause positive and negative charges, that is, hole-electron pairs. The photodiodes 12 are, for example, p-n junction photodiodes. The photodiodes 12 are connected to the accumulation control lines 51, and a certain voltage is applied to the accumulation control lines 51 during operation of the imaging device 100A. By applying the certain voltage to the accumulation control lines 51, either positive charges or negative charges generated as a result of photoelectric conversion are used as signal charges.

The pixels 10A each include a signal detection circuit electrically connected to the photodiode 12. In the example of the configuration illustrated in FIG. 1, the signal detection circuits each include an amplifier transistor 22 and a reset transistor 23. In this example, the signal detection circuits each further include an address transistor 21. The amplifier transistor 22, the reset transistor 23, and the address transistor 21 of each signal detection circuit are typically field-effect transistors (FETs) formed on the semiconductor substrate. In the following description, an example in which n-channel metal-oxide-semiconductor (MOS) transistors are used as the transistors will be described. Assignment of a source and a drain to two diffusion layer of each FET is determined on the basis of the polarity of the FET and potentials at the time. Assignment of a source and a drain can therefore vary depending on an operation state of each FET.

The pixels 10A each further include a capacitive element 60. The capacitive element 60 has a structure in which a dielectric layer such as an insulating film is sandwiched between electrodes. The electrodes herein are not limited to ones composed of a metal and may be interpreted to broadly include a polysilicon layer or the like. The electrodes herein may be parts of the semiconductor substrate.

In the example of the configuration illustrated in FIG. 1, a second diffusion region 3 (refer to FIG. 2) and one of the electrodes of each capacitive element 60 together form a charge accumulation region. A gate of each amplifier transistor 22 is also a part of the charge accumulation region. The charge accumulation region will also be referred to as a floating diffusion node. Here, the floating diffusion node refers to wires electrically connecting a drain of each reset transistor 23, an electrode of each capacitive element 60 that is not connected to a reference voltage PVDD, the gate of each amplifier transistor 22, and a cathode of each photodiode 12 and the second diffusion region 3. Charges generated by each photodiode 12 are accumulated in the charge accumulation region. In FIG. 1, the second diffusion region 3 is the drain of each reset transistor 23. The second diffusion region 3 may be either a source or a drain of a transistor other than the reset transistor 23, instead.

A drain of each amplifier transistor 22 is connected to the power supply line 50 for supplying the certain power supply voltage Vdd (e.g., about 3.3 V) to each pixel 10A during operation of the imaging device 100A. In other words, each amplifier transistor 22 outputs a signal voltage according to the amount of signal charge generated by the corresponding photodiode 12. A source of the amplifier transistor 22 is connected to a drain of the address transistor 21.

The vertical signal lines 41 are connected to sources of the address transistors 21. As illustrated in FIG. 1, the vertical signal line 41 is provided for each column of the pixels 10A, and the load circuit 42 and the column signal processing circuit 43 are connected to each of the vertical signal lines 41. Each load circuit 42 forms a source follower circuit together with the corresponding amplifier transistor 22.

The address signal lines 31 are connected to gates of the address transistors 21. The address signal line 31 is provided for each row of the pixels 10A. The address signal lines 31 are connected to the vertical scanning circuit 30, and the vertical scanning circuit 30 applies row selection signals for turning on or off the address transistors 21 to the address signal lines 31. As a result, rows to be read are scanned in a vertical direction (column direction) and selected. The vertical scanning circuit 30 controls turning on and off of the address transistors 21 through the address signal lines 31 to read outputs of the amplifier transistors 22 of the selected pixels 10A to the corresponding vertical signal lines 41. The arrangement of each address transistor 21 is not limited to the example illustrated in FIG. 1. Each address transistor 21 may be provided between the drain of the amplifier transistor 22 and the power supply line 50, instead.

The signal voltages from the pixels 10A output to the vertical signal lines 41 through the address transistors 21 are input to the corresponding column signal processing circuit 43 among column signal processing circuits 43 provided for the columns of the pixels 10A in correspondence with the vertical signal lines 41.

The reset signal lines 32 connected to the vertical scanning circuit 30 are connected to the gates of the reset transistor 23. As with the address signal lines 31, the reset signal line 32 is provided for each row of the pixels 10A. The vertical scanning circuit 30 applies row selection signals to the address signal lines 31 to select pixels 10A to be reset in units of rows. The vertical scanning circuit 30 also applies reset signals for controlling turning on and off of the reset transistors 23 to the gates of the reset transistors 23 through the reset signal lines 32 to turn on the reset transistors 23 in the selected rows. When the reset transistor 23 are turned on, potentials of the charge accumulation regions are reset.

In this example, a source of the reset transistor 23 is connected to one of the feedback lines 46 provided for the columns of the pixels 10A. That is, in this example, voltages of the feedback lines 46 are supplied to the charge accumulation regions as reset voltages for initializing charges of the photodiodes 12. Here, the feedback line 46 is connected to the output terminal of a corresponding one of the inverting amplifiers 45 provided for the columns of the pixels 10A.

One of the columns of the pixels 10A will be focused upon hereinafter. As illustrated in FIG. 1, the input terminal of the inverting amplifier 45 is connected to the vertical signal line 41 in the column. The output terminal of the inverting amplifier 45 is connected to one or more pixels 10A in the column through the feedback line 46. During operation of the imaging device 100A, a certain voltage Vref (e.g., a positive voltage of 1 V or about 1 V) is supplied to a non-inverting input terminal of the inverting amplifier 45. By selecting one of the one or more pixels 10A in the column and turning on the address transistor 21 and the reset transistor 23, a feedback path for negatively feeding back the output of the pixel 10A can be formed. As a result of the formation of the feedback path, the voltage of the vertical signal line 41 is restricted to the voltage Vref input to the non-inverting terminal of the inverting amplifier 45. In other words, as a result of the formation of the feedback path, the voltage of the charge accumulation region is reset to a voltage with which the voltage of the vertical signal line 41 becomes Vref. As the voltage Vref, any voltage within a range of the power supply voltage (e.g., 3.3 V) to ground voltage (0 V) may be used. The imaging device 100A thus includes the feedback circuits 47, each including the inverting amplifier 45 as a part of the feedback path.

As widely known, thermal noise called kTC noise is caused as a transistor is turned on or off. Noise caused as a reset transistor is turned on or off is called reset noise. Reset noise caused as the reset transistor 23 is turned off after the charge accumulation region is reset undesirably remains in the charge accumulation region before signal charges are accumulated. In the example of the configuration illustrated in FIG. 1, however, an alternating current component of kTC noise is fed back to the source of the reset transistor 23 as a result of the formation of the feedback path. Since the feedback path is formed until immediately before the reset transistor 23 is turned off in the example of the configuration illustrated in FIG. 1, reset noise caused as the reset transistor 23 is turned off can be reduced.

Figure 2:
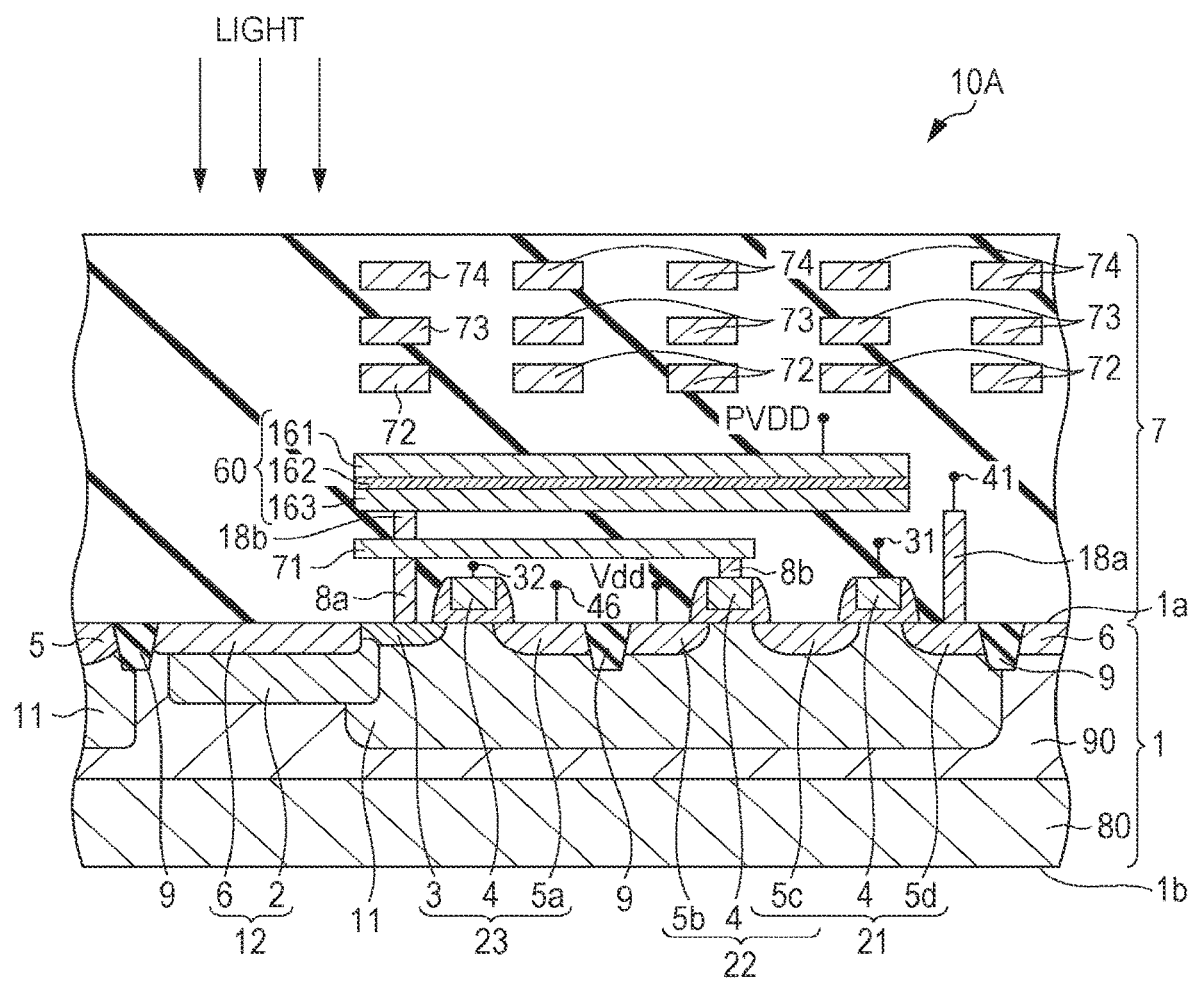
FIG. 2 is a diagram illustrating the configuration of a pixel in the imaging device according to the embodiment.

Next, the configuration of the pixels 10A according to the embodiment will be described with reference to FIG. 2. FIG. 2 is a diagram illustrating the configuration of each of the pixels 10A of the imaging device 100A according to the present embodiment.

In the present embodiment, an example in which the transistors are n-channel MOS transistors is described. A first conductivity type will be referred to as a p-type and a second conductivity type will be referred to as an n-type hereinafter.

The imaging device 100A according to the present embodiment includes a semiconductor substrate 1 and the pixels 10A. The semiconductor substrate 1 includes a p-type region 90 and an n-type region 80. The semiconductor substrate 1 also includes a first surface 1a and a second surface 1b opposite the first surface 1a. The first surface 1a is a surface in contact with an insulating layer 7. Contact plugs 8a and 8b, contact plugs 18a and 18b, a first wire 71, a second wire 72, a third wire 73, a fourth wire 74, and the like are provided in the insulating layer 7.

The pixels 10A each include, in the p-type region 90, a well region 11 including a p-type impurity, a photoelectric conversion unit 12 that converts incident light into charges, and the second diffusion region 3 that accumulates charges.

The photoelectric conversion unit 12 includes the first diffusion region 2 and a third diffusion region 6. The first diffusion region 2 is in contact with the p-type region 90 and the well region 11 and includes an n-type impurity, which is different from a p-type impurity. The third diffusion region 6 covers an upper surface of the first diffusion region. The third diffusion region 6 is exposed on the first surface 1a of the semiconductor substrate 1, in contact with the first diffusion region 2, and includes a p-type impurity. The first diffusion region 2 and the third diffusion region 6 together form a photodiode.

In the photoelectric conversion unit 12, the third diffusion region 6 is thus provided between the first diffusion region 2 and the first surface 1a of the semiconductor substrate 1, and dark current that can be caused due to a defect at an interface between the first diffusion region 2 and the p-type region 90 is pinned. As a result, dark current at the interface between the first diffusion region 2 and the p-type region 90 can be reduced more effectively.

The second diffusion region 3 is exposed on the first surface 1a of the semiconductor substrate 1, located in the well region 11, electrically connected to the first diffusion region 2 in the p-type region 90, includes an n-type impurity, and accumulates charges.

As a result, charges generated in the first diffusion region 2 can be directly accumulated in the charge accumulation region. In a conventional configuration, a transfer transistor is provided between a photodiode and a charge accumulation region. With this conventional configuration, dark current is caused due to the transfer transistor. In the imaging device according to the present disclosure, however, the first diffusion region 2 and the charge accumulation region are directly connected to each other electrically, and dark current caused during accumulation of charges can be reduced. As a result, charge accumulation efficiency can be improved. In addition, since each pixel circuit does not include a transfer transistor, the pixel circuit can be reduced. As a result, large photoelectric conversion units can be formed, and a dynamic range of the imaging device can be increased.

The pixels 10A each include a first transistor (hereinafter referred to as a reset transistor 23) including the second diffusion region 3 as either a source or a drain, the contact plug 8a connected to the second diffusion region 3, the capacitive element 60 electrically connected to the second diffusion region 3 through the contact plug 8a, and a second transistor (hereinafter referred to as an amplifier transistor 22) whose gate is electrically connected to the capacitive element 60.

In the examples illustrated in FIGS. 1 and 2, the reset transistors 23 each include the second diffusion region 3, a gate electrode 4, and an n-type impurity region 5a. The second diffusion region 3 is either the source or the drain of the reset transistor 23, and the n-type impurity region 5a is the other of the source and the drain of the reset transistor 23. The n-type impurity region 5a is electrically connected to the corresponding feedback line 46, and the gate electrode 4 is electrically connected to the corresponding reset signal line 32. The amplifier transistors 22 each include an n-type impurity region 5b, a gate electrode 4, and an n-type impurity region 5c. The n-type impurity region 5b is one of the source and the drain of the amplifier transistor 22, and the n-type impurity region 5c is the other of the source and the drain of the amplifier transistor 22. The n-type impurity region 5b is electrically connected to the certain power supply voltage Vdd, and the gate electrode 4 is electrically connected to the capacitive element 60 through the contact plug 8b. The address transistors 21 each include the n-type impurity region 5c, a gate electrode 4, and an n-type impurity region 5d. The n-type impurity region 5c is one of the source and the drain of the address transistor 21, and the n-type impurity region 5d is the other of the source and the drain of the address transistor 21. The n-type impurity region 5d is electrically connected to the corresponding vertical signal line 41 through the contact plug 18a, and the gate electrode 4 is electrically connected to the corresponding address signal line 31.

The capacitive element 60 may be provided in the semiconductor substrate 1, or may be provided in a layer other than the semiconductor substrate 1, namely, for example, the insulating layer 7 stacked on the semiconductor substrate 1. In the present embodiment, the capacitive element 60 is provided in the insulating layer 7 stacked on the semiconductor substrate 1. The capacitive element 60 includes an upper electrode 161, a lower electrode 163, and a dielectric film 162 located between the upper electrode 161 and the lower electrode 163. The upper electrode 161 is connected to the reference voltage PVDD of the capacitive element 60. The lower electrode 163 is in contact with the contact plug 18b. As a result, the capacitive element 60 is connected to the second diffusion region 3 through the contact plug 18b and the contact plug 8a and to the gate electrode 4 of the amplifier transistor 22 through the contact plug 18b, the first wire 71, and the contact plug 8b.

As described with reference to FIG. 1, the capacitive elements 60 each have a structure in which a dielectric (here, the dielectric film 162) is sandwiched between two electrodes (here, the upper electrode 161 and the lower electrode 163) composed of a metal or a metal compound. The structure in which a dielectric is sandwiched between two electrodes composed of a metal or a metal compound will be referred to as a "metal-insulator-metal (MIM) structure" hereinafter. In the present embodiment, the capacitive elements 60 are formed as capacitive elements 60 having a so-called MIM structure. The second diffusion regions 3 and the capacitive elements 60 formed in this manner are electrically connected to each other, so that the charge accumulation regions can achieve higher capacitances. The imaging device according to the present disclosure, therefore, can further increase the dynamic range.

In addition, for example, by setting the capacitances of the capacitive elements 60 twice or more as high as the capacitances of the second diffusion regions 3, saturation performance of the pixels 10A can be further improved. In order to set the capacitances of the capacitive elements 60 twice or more as high as the capacitances of the second diffusion regions 3, for example, the capacitive elements 60 may have the MIM structure and a relative dielectric constant of each dielectric film 162 sandwiched between the upper electrode 161 and the lower electrode 163 may be 10 or more. A dielectric film whose relative dielectric constant is 10 or more is, for example, a film composed of hafnium oxide. A relative dielectric constant of hafnium oxide is about 20. A relative dielectric constant of silicon oxide, which is used as a material of a conventional dielectric film having the MIM structure, is about 3.8 to 4. By making the relative dielectric constant of each dielectric film 162 larger, the capacitance of the capacitive element 60 can be made higher.

The pixels 10A each include a signal detection circuit electrically connected to the photoelectric conversion unit 12. In the example of the configuration illustrated in FIG. 2, the signal detection circuit includes the address transistor 21, the amplifier transistor 22, and the reset transistor 23. As illustrated in FIG. 2, the reset transistor 23 includes the second diffusion region 3, the n-type impurity region 5a, a part of a gate insulating film (not illustrated), and the gate electrode 4 on the gate insulating film. The second diffusion region 3 and the n-type impurity region 5a function as a drain region and a source region, respectively, of the reset transistor 23. The second diffusion region 3 is a region for temporarily accumulating signal charges generated by the first diffusion region 2 of the photoelectric conversion unit 12.

In addition, in the present embodiment, the reset transistor 23 is provided in the well region 11. The well region 11 has a p-type impurity concentration (p) slightly higher than a p-type impurity concentration (p−) of the p-type region 90.

Furthermore, in the present embodiment, an n-type impurity concentration of the second diffusion region 3 is lower than that of the n-type impurity region 5a, which is the other of the source and the drain of the reset transistor 23. As a result, a contact concentration at a contact part between the second diffusion region 3 and the well region 11 becomes lower, and dark current at an interface between the second diffusion region 3 and the well region 11 is reduced.

When viewed in a direction perpendicular to the semiconductor substrate 1, the second diffusion region 3 is smaller in area than the n-type impurity region 5a, which is the other of the source and the drain of the reset transistor 23. At this time, the area of the second diffusion region 3 and the n-type impurity region 5a may be, when viewed in the direction perpendicular to the semiconductor substrate 1, the area of the second diffusion region 3 and the n-type impurity region 5a except for overlaps with the gate electrode 4 of the reset transistor 23. That is, the area of the second diffusion region 3 and the n-type impurity region 5a may be, when viewed in the direction perpendicular to the semiconductor substrate 1, the area of parts of the second diffusion region 3 and the n-type impurity region 5a that do not overlap the gate electrode 4 of the reset transistor 23.

By making the area of the second diffusion region 3 smaller, dark current in the second diffusion region 3 can be reduced.

In the imaging device 100A according to the present embodiment, isolation regions 9 are provided between adjacent pixels 10A in such a way as to surround the pixels 10A when viewed in the direction perpendicular to the semiconductor substrate 1. The isolation regions 9 are insulating films for electrically separating adjacent pixels 10A from one another and provided in the p-type region 90. As a result, the signal detection circuits can be electrically separated from one another between adjacent pixels 10A. With this configuration, mixing of colors and blooming can be suppressed in the semiconductor substrate 1 between adjacent pixels 10A.

The isolation regions 9 may be provided in such a way as not only to electrically separate adjacent pixels 10A from one another but also to, for example, electrically separate adjacent elements provided in each pixel 10A from one another. In this case, for example, the isolation regions 9 are provided around the address transistor 21 and a combination of the amplifier transistor 22 and the reset transistor 23.

The isolation regions 9 are formed using an oxide such as silicon dioxide. Furthermore, the isolation regions 9 may be coated by a high-concentration p-type impurity. In this case, dark current caused at an interface between each isolation region 9 and an adjacent board or element can be reduced.

First Modification

Figure 3:
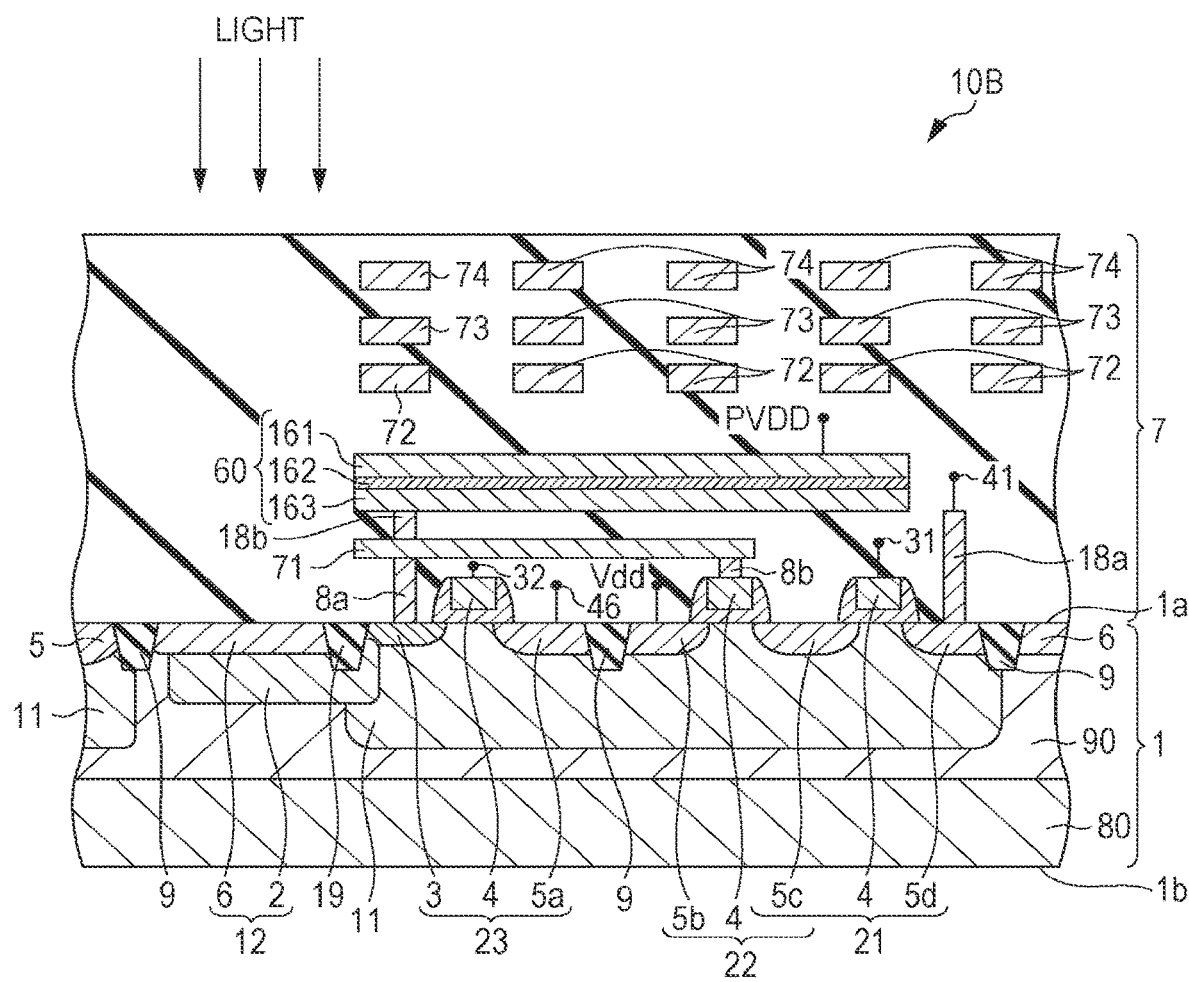
FIG. 3 is a diagram illustrating the configuration of a pixel according to a first modification of the embodiment.

Next, the configuration of pixels according to a first modification of the present embodiment will be described with reference to FIG. 3. FIG. 3 is a diagram illustrating the configuration of each of a plurality of pixels 10B according to the present modification. The circuit configuration of an imaging device according to the present modification is the same as that of the imaging device according to the embodiment illustrated in FIG. 1.

Components different from those according to the embodiment will be described hereinafter.

In the imaging device according to the present modification, the pixels 10B each include a first isolation region 19 for electrically insulating the third diffusion region 6 and the second diffusion region 3 from each other. As a result, dark current caused between the third diffusion region 6, which includes a p-type impurity, and the second diffusion region 3, which includes an n-type impurity, can be reduced.

As with the isolation regions 9, the first isolation region 19 is composed of an oxide such as silicon dioxide.

Second Modification

Figure 4:
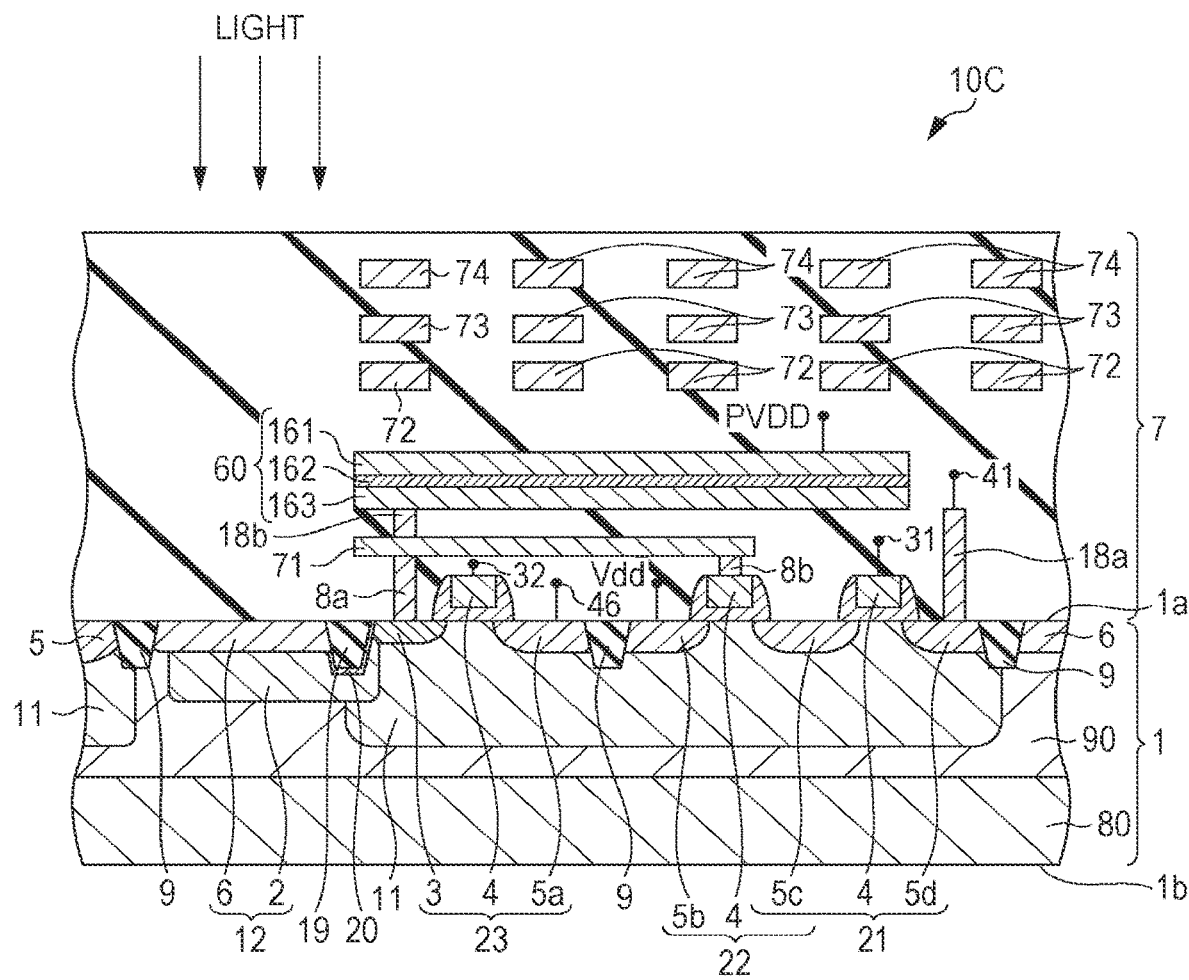
FIG. 4 is a diagram illustrating the configuration of a pixel according to a second modification of the embodiment.

Next, the configuration of pixels according to a second modification of the present embodiment will be described with reference to FIG. 4. FIG. 4 is a diagram illustrating the configuration of each of a plurality of pixels 10C according to the present modification.

Components different from those according to the embodiment and the first modification will be described hereinafter.

In an imaging device according to the present modification, the pixels 10C each include a second isolation region 20 that is located around the first isolation region 19 and that includes a p-type impurity with a concentration higher than in the third diffusion region 6.

As described above, the first isolation region 19 is composed of an oxide such as silicon dioxide. A defect might occur at an interface between the first isolation region 19 and the second diffusion region 3, and dark current might be caused due to the defect at the interface. By coating the first isolation region 19 with the second isolation region 20 composed of a high-concentration p-type impurity, therefore, a potential barrier is formed between the third diffusion region 6 and the second diffusion region 3, and the third diffusion region 6 and the second diffusion region 3 can be insulated more strongly from each other electrically. As a result, dark current caused between the third diffusion region 6 and the second diffusion region 3 can be further reduced.

Third Modification

Figure 5:
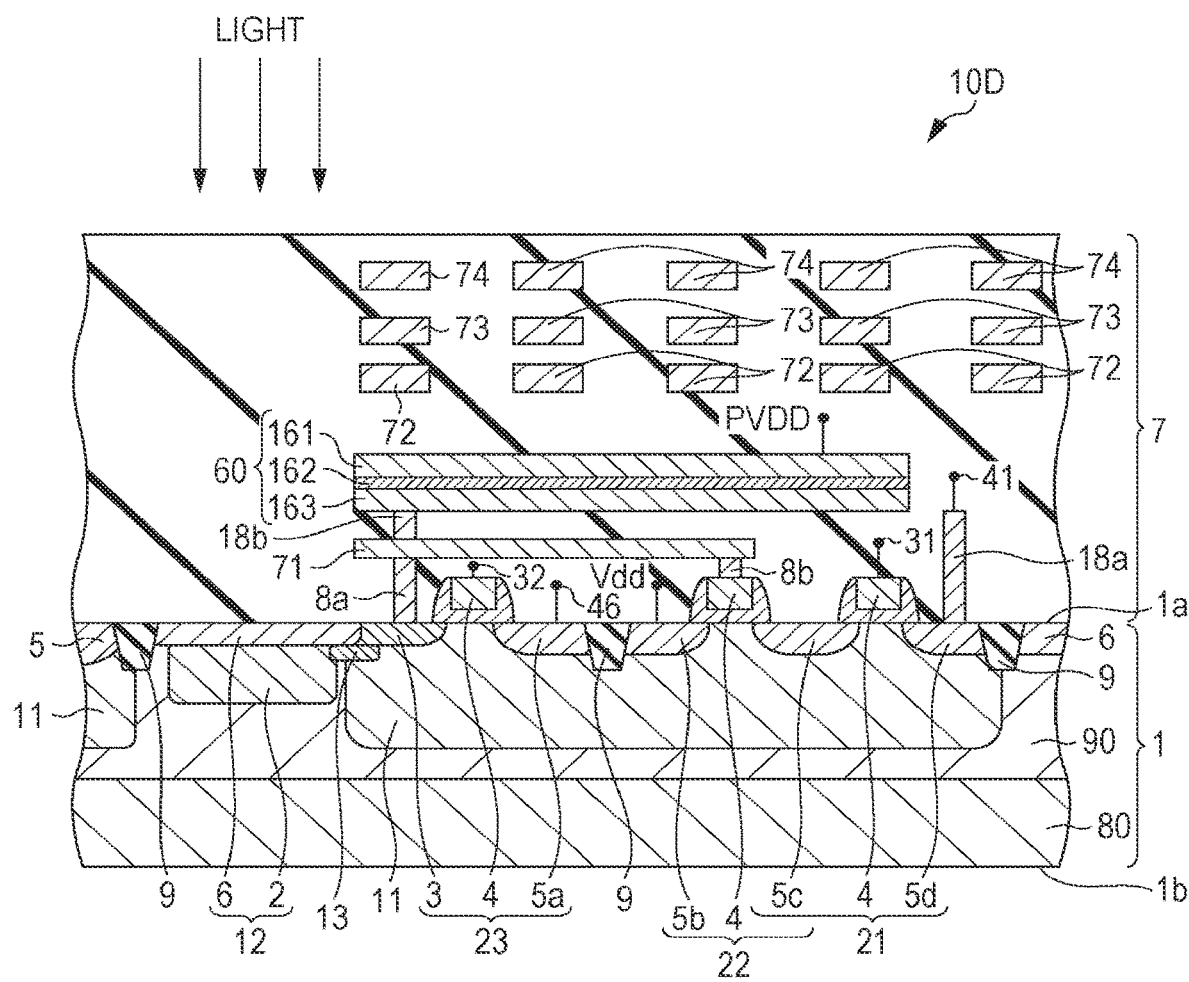
FIG. 5 is a diagram illustrating the configuration of a pixel according to a third modification of the embodiment.

Next, the configuration of pixels according to a third modification of the present embodiment will be described with reference to FIG. 5. FIG. 5 is a diagram illustrating the configuration of each of a plurality of pixels 10D according to the present modification.

Components different from those according to the embodiment will be described hereinafter.

In an imaging device according to the present modification, the pixels 10D each include a fourth diffusion region (hereinafter referred to as a "connection region 13") that is in contact with the first diffusion region 2 and the second diffusion region 3 and that includes an n-type impurity. In the imaging device according to the present modification, the first diffusion region 2 and the second diffusion region 3 are securely connected to each other electrically through the connection region 13. Charges generated in the first diffusion region 2, therefore, directly flow into the connection region 13 and are accumulated in the charge accumulation region including the second diffusion region 3.

Fourth Modification

Figure 6:
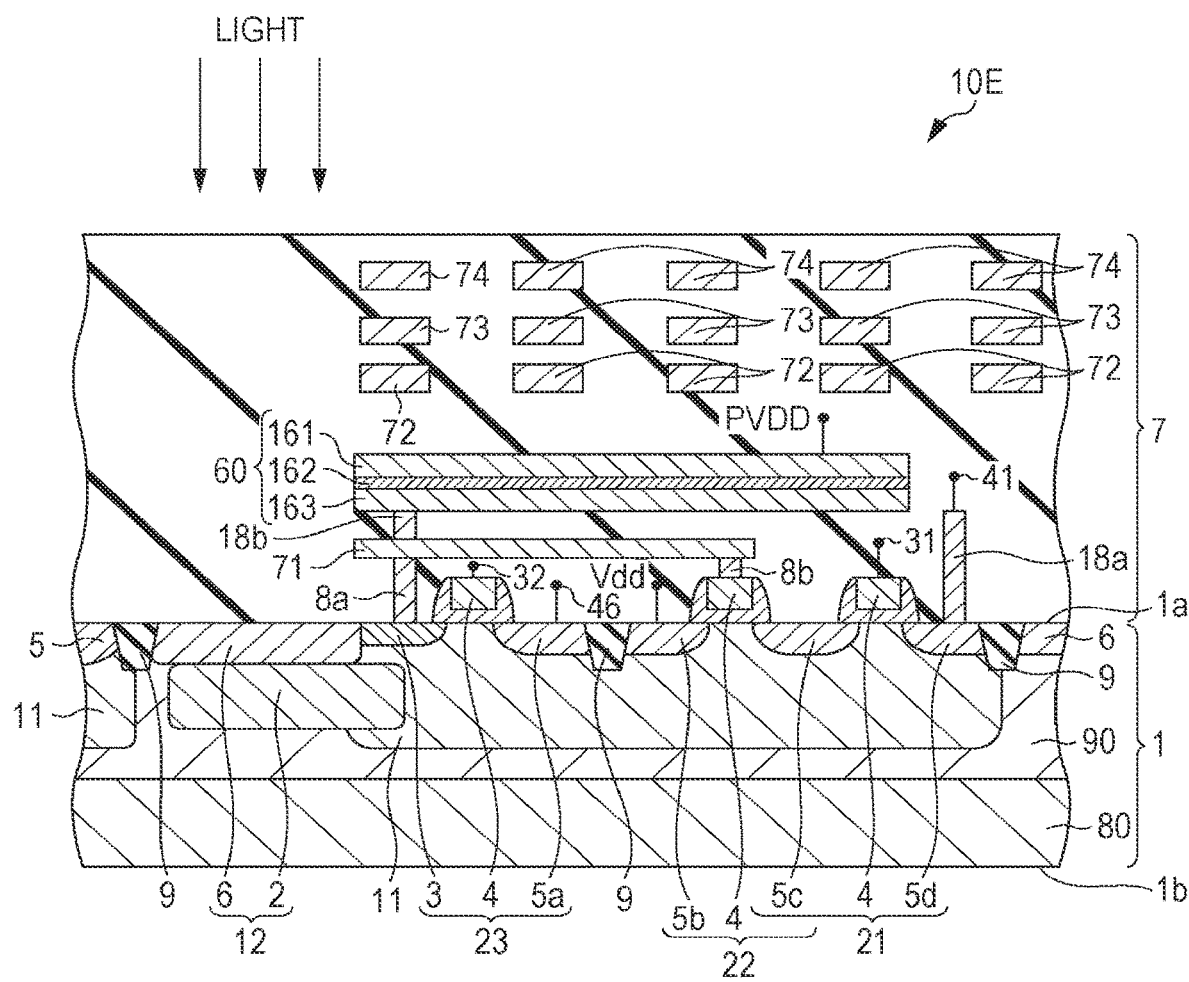
FIG. 6 is a diagram illustrating the configuration of a pixel according to a fourth modification of the embodiment.

Next, the configuration of pixels according to a fourth modification of the present embodiment will be described with reference to FIG. 6. FIG. 6 is a diagram illustrating the configuration of each of a plurality of pixels 10E according to the present modification.

Components different from those according to the embodiment will be described hereinafter.

In each of the pixels 10E of an imaging device according to the present modification, the first diffusion region 2 and the second diffusion region 3 face each other through the well region 11. As described above, the well region 11 includes a p-type impurity. In this structure in which a p-type impurity region is sandwiched between the first diffusion region 2 and the second diffusion region 3, which are n-type impurity regions, the p-type impurity region functions as a potential barrier. If the amount of charge generated in the first diffusion region 2 becomes equal to or larger than a certain value, therefore, charges flow into the second diffusion region 3 from the first diffusion region 2.

Although the imaging device according to the present disclosure has been described on the basis of an embodiment and modifications, the present disclosure is not limited to the embodiment and the modifications. The present disclosure also includes modes achieved by modifying the embodiment and the modifications in various ways conceivable by those skilled in the art and other modes achieved by combining together some components in the embodiment and the modifications, insofar as the scope of the present disclosure is not deviated from.

Figure 7:
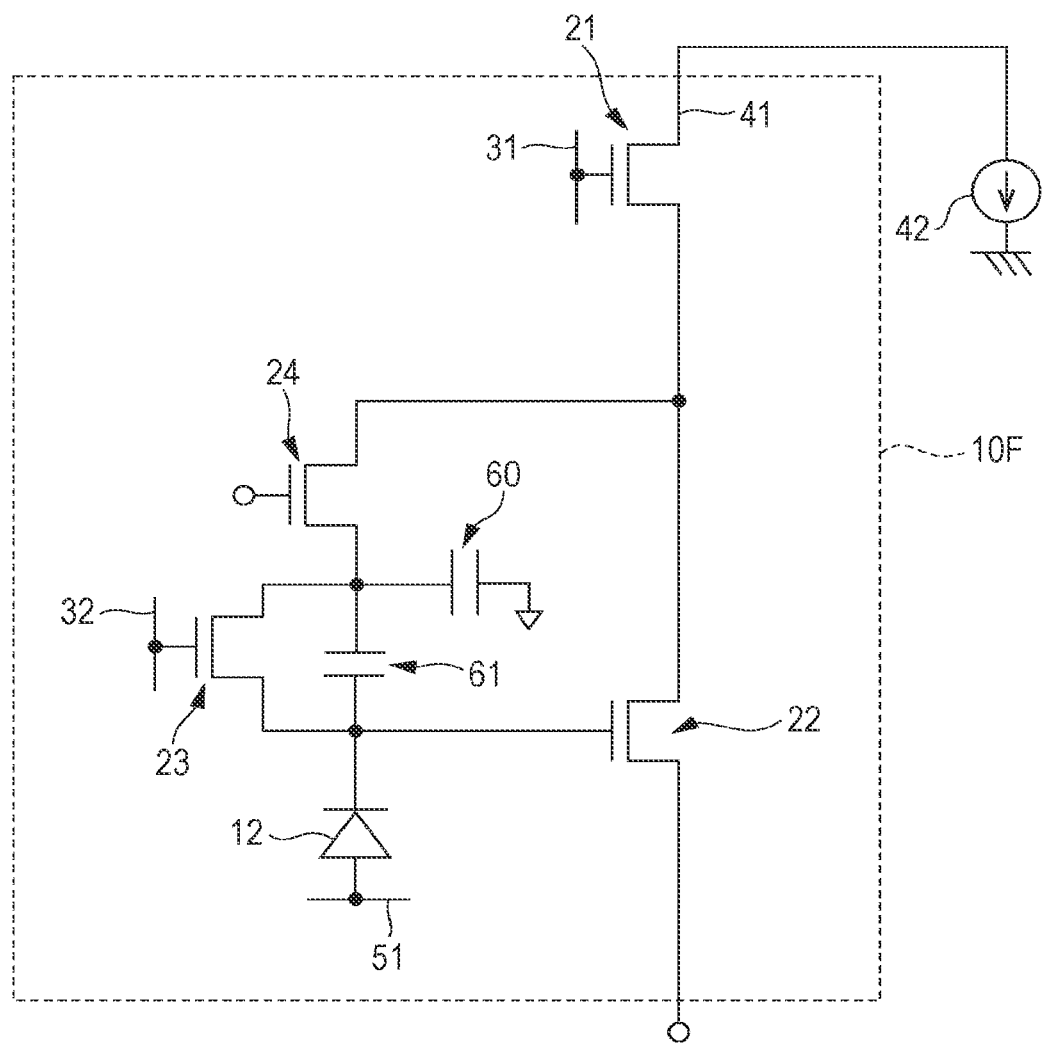
FIG. 7 is a diagram illustrating an example in which a pixel includes a feedback transistor.

As described above, although the imaging device 100A according to the present embodiment includes the inverting amplifiers 45 (refer to FIG. 1) in the circuit configuration, feedback transistors may be included instead of the inverting amplifiers 45. FIG. 7 is a diagram illustrating an example in which each of a plurality of pixels 10F includes a feedback transistor 24. Here, only components different from those of each of the pixels 10A illustrated in FIG. 1 will be described.

The pixels 10F are different from the pixels 10A in that the pixels 10F each include the feedback transistor 24 and a second capacitive element 61. In the configuration illustrated in FIG. 7, the vertical scanning circuit 30 (refer to FIG. 1) is also connected to feedback control lines (not illustrated). A gate of the feedback transistor 24 is connected to the corresponding feedback control line (not illustrated). By applying a certain voltage to the corresponding feedback control line (not illustrated) from the vertical scanning circuit 30, a feedback circuit for feeding back an output of a signal detection circuit to the second diffusion region 3 through the second capacitive element 61 or the reset transistor 23 can be formed. The second capacitive element 61 is a so-called coupling capacitor.

Referring back to FIG. 2, although the area of the second diffusion region 3 and the area of the n-type impurity region 5a when viewed in the direction perpendicular to the semiconductor substrate 1 are compared with each other in the present embodiment, distances between contact plugs connected to the second diffusion region 3 and the n-type impurity region 5a and the gate electrode 4 may be compared with each other. Here, the pixels 10A each include the contact plug 8a connected to the second diffusion region 3 and a contact plug (not illustrated) connected to the n-type impurity region 5a. The contact plug (not illustrated) is connected to the feedback line 46. In this case, the distance between the contact plug 8a of the second diffusion region 3 and the gate electrode 4 of the reset transistor 23 is smaller than the distance between the contact plug (not illustrated) of the n-type impurity region 5a and the gate electrode 4 of the reset transistor 23.

As a result, the distance between the contact plug 8a of the second diffusion region 3 and the gate electrode 4 of the reset transistor 23 becomes short, thereby reducing an increase in a resistance of the second diffusion region 3.

In addition, according to the embodiment and the modifications of the present disclosure, an effect of dark current can be reduced, and an imaging device capable of performing high-quality imaging is provided. The above-described address transistor 21, amplifier transistor 22, and reset transistor 23 may each be an n-channel MOS transistor or a p-channel MOS transistor. When each transistor is a p-channel MOS transistor, an impurity of the second conductivity type is a p-type impurity, and an impurity of the first conductivity type is an n-type impurity. Not all these transistors need to be either an n-channel MOS transistor or a p-channel MOS transistor. When each of the transistors in a pixel is an n-channel MOS transistor and electrons are used as signal charges, positions of the source and the drain of each of the transistors may be switched.

Although each of the pixels of the imaging device 100A according to the present embodiment includes a photoelectric conversion unit having the same sensitivity, each of the pixels may include two pixels having different sensitivities, instead.

Figure 8:
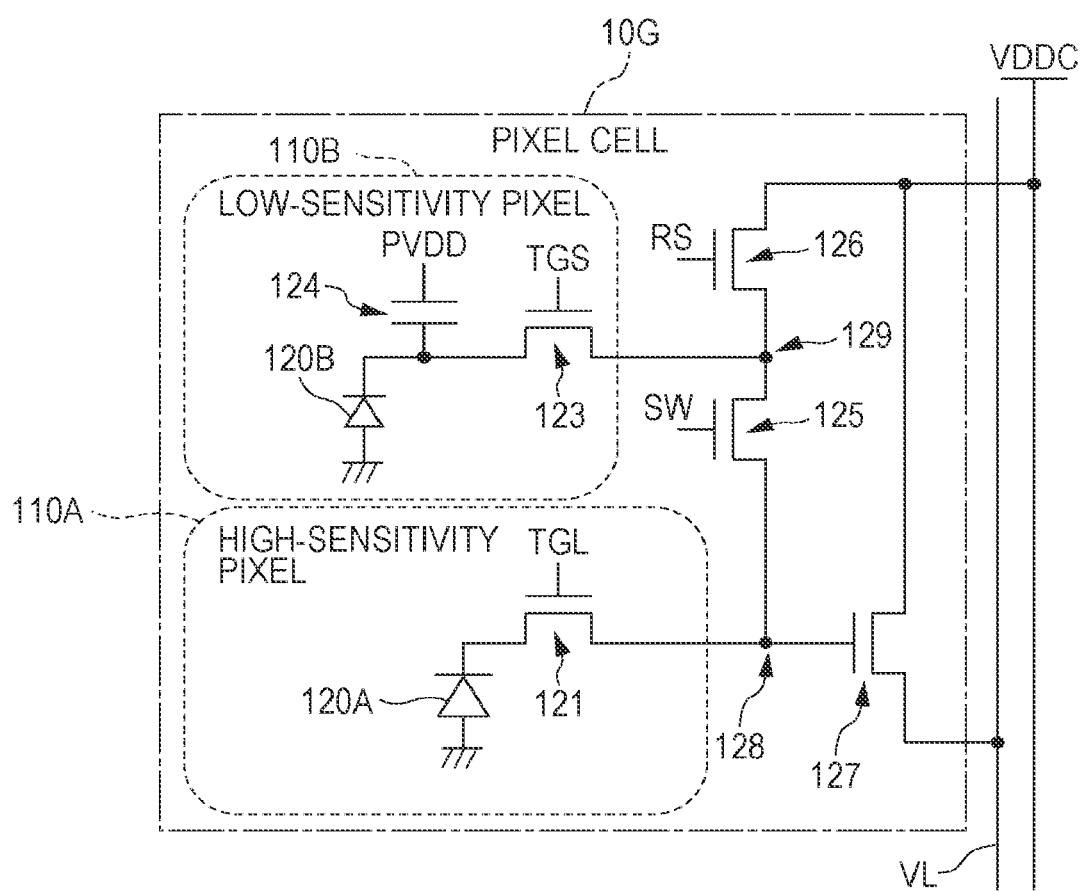
FIG. 8 is a diagram illustrating an example of the circuit configuration of a pixel cell including two pixels having different sensitivities.

FIG. 8 is a diagram illustrating an example of the circuit configuration of a pixel cell 10G including two pixels 110A and 110B having different sensitivities. The pixel cell 10G includes a first photoelectric conversion unit 120A, a first transfer transistor 121, a second photoelectric conversion unit 120B, a second transfer transistor 123, a charge accumulation unit 124, a switch transistor 125, a reset transistor 126, an amplifier transistor 127, a first charge accumulation region 128, and a second charge accumulation region 129. In FIG. 8, a high-sensitivity pixel 110A surrounded by a broken line corresponds to the first photoelectric conversion unit 120A, the first charge accumulation region 128, and the first transfer transistor 121. A low-sensitivity pixel 110B corresponds to the second photoelectric conversion unit 120B, the second charge accumulation region 129, the second transfer transistor 123, and the charge accumulation unit 124.

The first photoelectric conversion unit 120A (hereinafter also referred to as a "first photodiode 120A") is a photodiode formed in a semiconductor substrate and converts light into signal charges.

The first transfer transistor 121 turns on when a transfer control line TGL is at high level. As a result, the first transfer transistor 121 transfers signal charges obtained by the first photoelectric conversion unit 120A as a result of photoelectric conversion to the first charge accumulation region 128.

The second photoelectric conversion unit 120B (hereinafter referred to as a "second photodiode 120B") is a photodiode formed in the semiconductor substrate, has a light receiving area smaller than the first photoelectric conversion unit 120A, and converts light into signal charges.

The second transfer transistor 123 turns on when, for example, the transfer control line TGS is at high level. As a result, the second transfer transistor 123 transfers, to the second charge accumulation region 129, signal charges obtained by the second photoelectric conversion unit 120B as a result of photoelectric conversion and accumulated in the charge accumulation unit 124. In the configuration illustrated in FIG. 8, a second diffusion region that accumulates charges generated by the second photoelectric conversion unit 120B is a drain of the second transfer transistor 123. The second diffusion region is electrically connected to the second photoelectric conversion unit 120B, and charges generated by the second photoelectric conversion unit 120B can be directly accumulated in the second diffusion region.

The charge accumulation unit 124 is a capacitive element that accumulates signal charges generated by the second photoelectric conversion unit 120B as a result of photoelectric conversion. The charge accumulation unit 124 is formed as having the MIM structure and includes two electrode portions. One of the two electrode portions is connected to the power supply voltage PVDD, and the other electrode portion is connected to the drain of the second transfer transistor 123. The charge accumulation unit 124 accumulates signal charges generated by the second photoelectric conversion unit 120B as a result of photoelectric conversion. The signal charges accumulated in the charge accumulation unit 124 are transferred by the second transfer transistor 123 to the second charge accumulation region 129 when the transfer control line TGS is at high level. The charge accumulation unit 124 plays a role of significantly increasing a maximum accumulation capacity (i.e., saturation signal charge) of signal charges generated by the second photoelectric conversion unit 120B as a result of photoelectric conversion. The charge accumulation unit 124 may have the same configuration as the capacitive element 60 (e.g., refer to FIG. 2).

When a switch control line SW is at high level, for example, the switch transistor 125 makes the first charge accumulation region 128 and the second charge accumulation region 129 electrically conductive to each other.

When a reset control line RS is at high level, for example, the reset transistor 126 resets the second charge accumulation region 129 to high level.

The amplifier transistor 127 forms a source follower circuit in combination with a constant current source in a constant current source circuit, converts the potential of the first charge accumulation region 128 into a voltage, and outputs the voltage to a vertical signal line VL.

The first charge accumulation region 128 includes a floating diffusion layer formed in the semiconductor substrate and holds signal charges transferred from the first transfer transistor 121.

The second charge accumulation region 129 includes a floating diffusion layer formed in the semiconductor substrate and holds signal charges transferred from the second transfer transistor 123.

As described above, by adding the charge accumulation unit 124 to the second photoelectric conversion unit 120B, whose light receiving area is smaller than that of the first photoelectric conversion unit 120A, saturation charge can be increased although the sensitivity of the second photoelectric conversion unit 120B is lower than that of the first photoelectric conversion unit 120A. The low-sensitivity pixel 110B, therefore, can achieve a wide dynamic range. As a result, the high-sensitivity pixel 110A mainly captures low-illuminance images, and the low-sensitivity pixel 110B captures high-illuminance images, thereby obtaining images of a wide dynamic range. In addition, although the above-described kTC noise is caused in the low-sensitivity pixel 110B of the pixel cell 10G, an effect of the kTC noise is small since the low-sensitivity pixel 110B mainly captures high-illuminance images and a signal component is large compared to the kTC noise.

Next, the operation of the example of the circuit of the pixel cell 10G illustrated in FIG. 8 will be described specifically.

As illustrated in FIG. 8, in the pixel cell 10G in this example of the circuit, the high-sensitivity pixel 110A and the low-sensitivity pixel 110B share the switch transistor 125, the reset transistor 126, and the amplifier transistor 127. That is, the high-sensitivity pixel 110A includes elements for performing photoelectric conversion, namely, for example, the first photoelectric conversion unit 120A and the first transfer transistor 121. The low-sensitivity pixel 110B includes the second photodiode 120B, the second transfer transistor 123, and the charge accumulation unit 124. In addition, the pixel cell 10G includes the switch transistor 125, the reset transistor 126, and the amplifier transistor 127 shared between the high-sensitivity pixel 110A and the low-sensitivity pixel 110B. As the transistors 121, 123, 125, 126, and 127 (hereinafter referred to as the "transistors 121 to 127"), for example, n-channel MOS transistors may be used. The n-channel MOS transistors turn on when gate potential is at "high" level and turn off when the gate potential is at "low" level. P-channel MOS transistors, on the other hand, are assumed to turn on when the gate potential is at "low" level and turn off when the gate potential is at "high" level. In the example illustrated in FIG. 8, the transistors 121 to 127 are n-channel MOS transistors.

The first transfer transistor 121 is connected between a cathode electrode of the first photodiode 120A and the first charge accumulation region 128. The transfer control line TGL is connected to a gate electrode of the first transfer transistor 121. When "high" level is supplied to the gate electrode of the first transfer transistor 121 from the transfer control line TGL through transfer pulses, the first transfer transistor 121 turns on, and the first photodiode 120A performs photoelectric conversion. As a result, signal charges accumulated in the first photodiode 120A are transferred to the first charge accumulation region 128. In this example, the signal charges are electrons.

The second transfer transistor 123 is connected between the electrode portion of the charge accumulation unit 124 connected to the semiconductor substrate and the second charge accumulation region 129. The transfer control line TGS is connected to a gate electrode of the second transfer transistor 123. When "high" level is supplied to the gate electrode of the second transfer transistor 123 from the transfer control line TGS using transfer pulses, the second transfer transistor 123 turns on, and the second photodiode 120B performs photoelectric conversion. As a result, signal charges accumulated in the second photodiode 120B and signal charges accumulated between the electrode portion of the charge accumulation unit 124 and the semiconductor substrate are transferred to the second charge accumulation region 129.

The reset control line RS is connected to a gate electrode of the reset transistor 126. The power supply voltage VDDC is applied to a drain electrode through a power supply wire, and the second charge accumulation region 129 is connected to a source electrode. In addition, with regard to the switch transistor 125, the switch control line SW is connected to a gate electrode, the second charge accumulation region 129 is connected to a drain electrode, and the first charge accumulation region 128 is connected to a source electrode.

First, reading control performed by the high-sensitivity pixel 110A will be described.

"High" level is supplied to the gate electrode of the reset transistor 126 through the reset control line RS using reset pulses φRS before the first photodiode 120A transfers signal charges to the first charge accumulation region 128. In addition, "high" level is supplied to the gate electrode of the switch transistor 125 through the switch control line SW using switch pulses. As a result, the reset transistor 126 and the switch transistor 125 turn on. Consequently, potentials of the first charge accumulation region 128 and the second charge accumulation region 129 are reset to the power supply voltage VDDC. After the potentials of the first charge accumulation region 128 and the second charge accumulation region 129 are reset to the power supply voltage VDDC, "high" level is supplied to the gate electrode of the reset transistor 126 using the reset pulses and "low" level is supplied to the gate electrode of the switch transistor 125 using switch pulses. As a result, a reset operation for the first charge accumulation region 128 is completed.

A gate electrode of the amplifier transistor 127 is connected to the first charge accumulation region 128, the power supply voltage VDDC is applied to a drain electrode of the amplifier transistor 127 through a power supply wire, and the vertical signal line VL is connected to a source electrode of the amplifier transistor 127. The amplifier transistor 127 outputs a potential of the first charge accumulation region 128 reset by the reset transistor 126 and the switch transistor 125, to the vertical signal line VL as reset level. The amplifier transistor 127 outputs a potential of the first charge accumulation region 128 after the first transfer transistor 121 transfers signal charges, to the vertical signal line VL as signal level.

Next, reading control performed by the low-sensitivity pixel 110B will be described. The reset transistor 126 and the switch transistor 125 are turned on to reset the potentials of the first charge accumulation region 128 and the second charge accumulation region 129 to the power supply voltage VDDC before the charge accumulation unit 124 transfers signal charges to the second charge accumulation region 129. After the potentials of the first charge accumulation region 128 and the second charge accumulation region 129 are reset to the power supply voltage VDDC, "low" level is supplied to the gate electrode of the reset transistor using the reset pulses φRS. In addition, "high" level is supplied to the gate electrode of the switch transistor using switch pulses. As a result, the reset operation is completed with the first charge accumulation region 128 and the second charge accumulation region 129 electrically connected to each other.

The amplifier transistor 127 outputs, to the vertical signal line VL as reset level, the potentials of the first charge accumulation region 128 and the second charge accumulation region 129 reset by the reset transistor 126 and the switch transistor 125. Furthermore, the amplifier transistor 127 outputs, to the vertical signal line VL as signal level, the potentials of the first charge accumulation region 128 and the second charge accumulation region 129 after the second transfer transistor 123 transfers signal charges.

Here, the first charge accumulation region 128 and the second charge accumulation region 129 transmit a voltage according to the amount of signal charge to the amplifier transistor 127. An equation for converting the amount of signal charge into voltage is $\Delta V = Q/C$, and conversion efficiency $\eta$ is represented by $\eta = 1/C$. The conversion efficiency $\eta$ is determined by capacitances C of the first charge accumulation region 128 and the second charge accumulation region 129. When signal charges of the low-sensitivity pixel 110B are read, the first charge accumulation region 128 and the second charge accumulation region 129 are connected to the gate electrode of the amplifier transistor 127. When signal voltage of the high-sensitivity pixel 110A is read, on the other hand, only the first charge accumulation region 128 is connected to the gate electrode of the amplifier transistor 127. The conversion efficiency $\eta$ of the low-sensitivity pixel 110B, therefore, is lower than the conversion efficiency $\eta$ of the high-sensitivity pixel 110A.

Here, the amount of signal charge can be more efficiently converted into voltage and a voltage of signal amplitude becomes higher as the conversion efficiency $\eta$ becomes higher. As a result, a ratio S/N of a pixel signal S to a noise component N caused by a constant current source circuit and a reading circuit connected to the vertical signal line VL improves, and a high-quality image can be obtained.

The high-sensitivity pixel 110A obtains image data regarding a subject in a low-illuminance environment, and the low-sensitivity pixel 110B obtains an image data of a subject in a high-illuminance environment. By combining together image data obtained from two pixels having different sensitivities, image data of a wider dynamic range than that of image data obtained from pixels having the same sensitivity can be obtained.

The imaging device is required to generate high-quality images so that images can be obtained in various environments. In order to obtain high-quality images in a low-illuminance environment, especially with an illuminance of less than 1 lux, the high-sensitivity pixel 110A is required to achieve higher conversion efficiency η. In order to achieve higher conversion efficiency, the capacitance C of the first charge accumulation region 128 needs to be smaller.

In order to obtain high-quality images in a high-illuminance environment, especially in direct sunlight, on the other hand, the charge accumulation unit 124 of the low-sensitivity pixel 110B needs to accumulate a larger amount of signal charge. For this purpose, lower conversion efficiency η is required. In order to achieve lower conversion efficiency, the capacitance C of the second charge accumulation region 129 needs to be higher.

In the configuration illustrated in FIG. 8, the switch transistor 125 is provided between the first charge accumulation region 128 and the second charge accumulation region 129, and the amplifier transistor 127 is connected to the first charge accumulation region 128. When signal charges of the high-sensitivity pixel 110A are read, the switch transistor 125 is turned off. As a result, the gate electrode of the amplifier transistor 127 is connected only to the first charge accumulation region 128, and higher conversion efficiency η is achieved. In addition, when signal charges of the low-sensitivity pixel 110B are read, the switch transistor 125 is turned on. As a result, the first charge accumulation region 128 and the second charge accumulation region 129 are connected to the gate electrode of the amplifier transistor 127, and lower conversion efficiency η is achieved.

Here, in order to achieve desired conversion efficiency η for the low-sensitivity pixel 110B, a capacitor may be provided for the second charge accumulation region 129. At this time, because the high-sensitivity pixel 110A reads signal charges with the switch transistor 125 turned off, the conversion efficiency η of the high-sensitivity pixel 110A is not affected, and high image quality can be maintained.

When the switch transistor 125 is turned on in the reading operation performed by the high-sensitivity pixel 110A, it is desirable to turn off the reset transistor 126 as in the reading operation performed by the low-sensitivity pixel 110B. As a result, signal charges can be read with the conversion efficiency η of the first charge accumulation region 128 and the second charge accumulation region 129 reduced. When an image of a subject is captured in a high-illuminance environment, the amount of signal charge accumulated in the first photodiode 120A of the high-sensitivity pixel 110A is larger than the amount of signal charge when an image of a subject is captured in a low-illuminance environment. The above method, therefore, is effective as means for preventing the voltage ΔV of the amount of signal charge from exceeding a dynamic range of the vertical signal line VL.

In addition, although one high-sensitivity pixel 110A and one low-sensitivity pixel 110B share the switch transistor 125, the reset transistor 126, and the amplifier transistor 127 in the pixel cell 10G, two high-sensitivity pixels 110A and two low-sensitivity pixels 110B may share the switch transistor 125, the reset transistor 126, and the amplifier transistor 127, instead.

In addition, a selection transistor for selecting a row corresponding to a reading row of a pixel array may be connected between the source of the amplifier transistor 127 and the vertical signal line VL.

Figure 9:
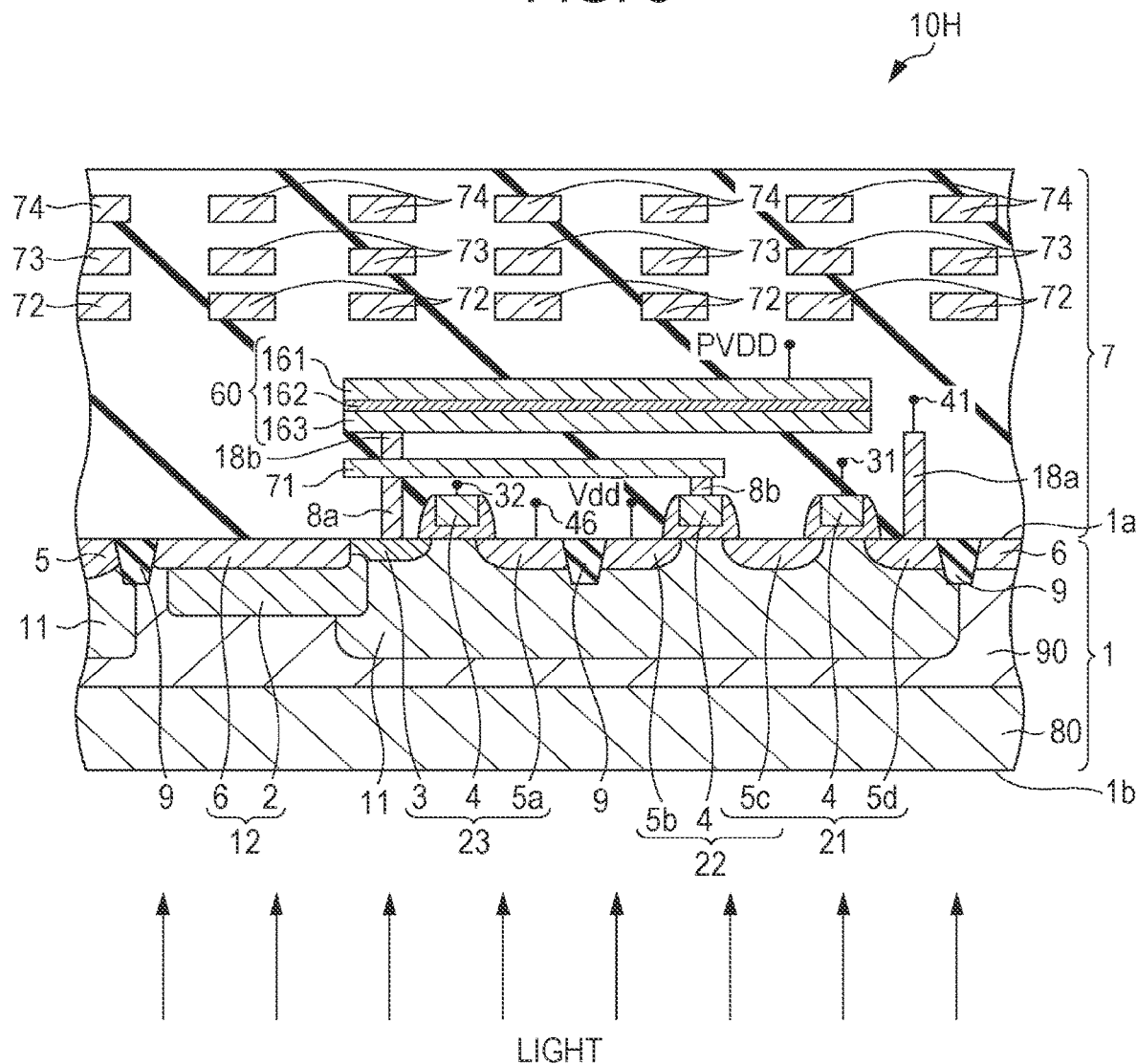
FIG. 9 is a diagram illustrating the configuration of a pixel in an imaging device according to another embodiment.

Although a mode in the above embodiment and modifications in which light enters the photoelectric conversion unit 12 from a side of the second wire 72 to the fourth wire 74 (hereinafter referred to as "wiring"), that is, although an imaging device of a front surface illumination type, has been described, an imaging device of a back illumination type illustrated in FIG. 9 may be used, instead. FIG. 9 is a diagram illustrating the configuration of each of a plurality of pixels 10H of an imaging device according to another embodiment. Differences from the pixels according to the above embodiment and modifications will be described through comparison.

In an imaging device of the front illumination type, for example, light enters the photoelectric conversion unit 12 from the side of the wiring as in the cases of the pixels 10A to 10E illustrated in FIGS. 2 to 6, respectively. In an imaging device of the back illumination type, on the other hand, light enters the photoelectric conversion unit 12 from a side of the semiconductor substrate 1, for example, as illustrated in FIG. 9. In an imaging device of the front illumination type, the photoelectric conversion unit 12 and the wiring need to be arranged such that light incident on the photoelectric conversion unit 12 is not blocked by the wiring. It is therefore difficult to increase the light receiving area of the photoelectric conversion unit 12 to a certain value or more. In addition, space in which the wiring is arranged is also limited. In the imaging device of the back illumination type illustrated in FIG. 9, on the other hand, the wiring is provided on a side opposite a side on which light enters the photoelectric conversion unit 12, and the wiring does not block light incident on the photoelectric conversion unit 12. As a result, the light receiving area of the photoelectric conversion unit 12 can be increased. In addition, the wiring can be arranged arbitrarily. In FIG. 9, for example, the second wire 72, the third wire 73, and the fourth wire 74 are arranged above the photoelectric conversion unit 12. In the imaging device illustrated in FIG. 9, the n-type region 80 may be formed thinly. As a result, light easily enters the photoelectric conversion unit 12.

According to the present disclosure, since a dynamic range can be increased while reducing dark current, an imaging device capable of performing high-quality imaging can be provided. The imaging device in the present disclosure, for example, is effective as an image sensor, a digital camera, or the like. The imaging device in the present disclosure can be used for a medical camera, a robot camera, a security camera, a camera mounted on a vehicle, or the like.

What is claimed is:
1. An imaging device comprising:
a semiconductor substrate including:
a semiconductor region including an impurity of a first conductivity type,
a first diffusion region that is in contact with the semiconductor region, that includes an impurity of a second conductivity type different from the first conductivity type, and that converts incident light into charges, and
a second diffusion region that includes an impurity of the second conductivity type and that directly accumulates at least a part of the charges generated in the first diffusion region;
a contact plug in contact with the second diffusion region;
a capacitive element electrically connected to the second diffusion region through the contact plug; and
a first transistor that includes the second diffusion region as one of a source and a drain,
wherein no transistor exists between the first diffusion region and the second diffusion region.
2. The imaging device according to claim 1, further comprising:
a second transistor that includes a gate electrode, and
wherein the second diffusion region is coupled to the gate electrode through the contact plug.

3. The imaging device according to claim 2, wherein:
the semiconductor substrate includes another diffusion region including an impurity of the second conductivity type,
the first transistor includes the another diffusion region as the other of the source and the drain, and
a concentration of the impurity of the second conductivity type in the second diffusion region is lower than a concentration of the impurity of the second conductivity type in the another diffusion region.

4. The imaging device according to claim 2, wherein:
the semiconductor substrate includes another diffusion region including an impurity of the second conductivity type,
the first transistor includes the another diffusion region as the other of the source and the drain, and
when viewed in a direction perpendicular to the semiconductor substrate, an area of the second diffusion region is smaller than an area of the another diffusion region.

5. The imaging device according to claim 1, wherein the capacitive element includes a first electrode, a second electrode, and a dielectric film between the first electrode and the second electrode, both the first electrode and the second electrode being located above the semiconductor substrate.

6. The imaging device according to claim 1, wherein the capacitive element includes a first electrode, a second electrode, and a dielectric film between the first electrode and the second electrode, a dielectric constant of the dielectric film being 10 or more.

7. The imaging device according to claim 1, wherein the capacitive element includes a first electrode, a second electrode, and a dielectric film between the first electrode and the second electrode, at least one of the first electrode and the second electrode including a metal.

8. The imaging device according to claim 1, wherein the capacitive element includes a MIM capacitor.

9. The imaging device according to claim 1, wherein
the semiconductor substrate includes a first surface and a second surface opposite to the first surface,
the incident light enters the first diffusion region through the second surface, and
the capacitive element is closer to the first surface than to the second surface.

10. The imaging device according to claim 1, wherein the capacitive element overlaps the first diffusion region in a plan view.

11. The imaging device according to claim 1, wherein the semiconductor substrate includes a third diffusion region that covers an upper surface of the first diffusion region and that includes an impurity of the first conductivity type.

12. The imaging device according to claim 11, wherein the semiconductor substrate includes a first isolation region that electrically insulates the second diffusion region and the third diffusion region from each other.

13. The imaging device according to claim 12, wherein
the first isolation region includes a second isolation region, and
a concentration of the impurity of the first conductivity type in the second isolation region is higher than a concentration of the impurity of the first conductivity type in the third diffusion region.

14. The imaging device according to claim 1, wherein:
the first transistor includes a gate electrode located on the semiconductor substrate, and
the second diffusion region and the contact plug are located on a same side as the first diffusion region with respect to the gate electrode of the first transistor.

15. An imaging device comprising:
a semiconductor substrate including:
a semiconductor region including an impurity of a first conductivity type,
a first diffusion region that is in contact with the semiconductor region, that includes an impurity of a second conductivity type different from the first conductivity type, and that converts incident light into charges, and
a second diffusion region that includes an impurity of the second conductivity type and that directly accumulates at least a part of the charges generated in the first diffusion region;
a contact plug in contact with the second diffusion region; and
a capacitive element electrically connected to the second diffusion region through the contact plug,
wherein the semiconductor substrate includes a well region including an impurity of the first conductivity type, and the second diffusion region is located in the well region.

16. The imaging device according to claim 15, wherein the second diffusion region faces the first diffusion region through the well region.

17. An imaging device comprising:
a semiconductor substrate including:
a semiconductor region including an impurity of a first conductivity type,
a first diffusion region that is in contact with the semiconductor region, that includes an impurity of a second conductivity type different from the first conductivity type, and that converts incident light into charges, and
a second diffusion region that includes an impurity of the second conductivity type and that directly accumulates at least a part of the charges generated in the first diffusion region;
a contact plug in contact with the second diffusion region; and
a capacitive element electrically connected to the second diffusion region through the contact plug,
wherein the semiconductor substrate includes a third diffusion region that is in contact with the first diffusion region and the second diffusion region and that includes an impurity of the first conductivity type, and the first diffusion region is not in contact with the second diffusion region.

18. The imaging device according to claim 17, further comprising:
a first transistor that includes the second diffusion region as one of a source and a drain.

19. The imaging device according to claim 18, further comprising:
a second transistor that includes a gate electrode,
wherein the second diffusion region is coupled to the gate electrode through the contact plug.

* * * * *